(12) United States Patent
Sugawara

(10) Patent No.: US 7,002,781 B2
(45) Date of Patent: Feb. 21, 2006

(54) CURRENT-PERPENDICULAR-TO-THE-PLANE STRUCTURE MAGNETORESISTIVE ELEMENT HAVING THE FREE AND/OR PINNED LAYERS BEING MADE OF A GRANULAR FILM WHICH INCLUDES AN ELECTRICALLY CONDUCTIVE MAGNETIC MATERIAL AND A DIELECTRIC MATERIAL

(75) Inventor: Takahiko Sugawara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 340 days.

(21) Appl. No.: 10/652,832

(22) Filed: Aug. 29, 2003

(65) Prior Publication Data

US 2004/0052008 A1 Mar. 18, 2004

(30) Foreign Application Priority Data

Sep. 9, 2002 (JP) .............................. 2002-262529

(51) Int. Cl.
*G11B 5/39* (2006.01)
(52) U.S. Cl. .............................. 360/324.11; 360/324.12; 360/324.2
(58) Field of Classification Search . 360/324.11–324.2
See application file for complete search history.

(56) References Cited

U.S. PATENT DOCUMENTS

| 6,064,552 | A  | * | 5/2000 | Iwasaki et al. ............ 360/322 |
| 6,686,068 | B1 | * | 2/2004 | Carey et al. ............. 428/811.3 |
| 6,707,649 | B1 | * | 3/2004 | Hasegawa et al. ..... 360/324.12 |
| 6,751,074 | B1 | * | 6/2004 | Inomata et al. .......... 360/324.2 |
| 2003/0090844 | A1 | * | 5/2003 | Shimizu et al. ........ 360/324.12 |
| 2003/0231436 | A1 | * | 12/2003 | Nishiyama ............... 360/324.1 |
| 2004/0042127 | A1 | * | 3/2004 | Hoshiya et al. ............ 360/322 |

FOREIGN PATENT DOCUMENTS

JP 2001-084526 3/2001

* cited by examiner

*Primary Examiner*—A. J. Heinz
(74) *Attorney, Agent, or Firm*—Greer, Burns & Crain, Ltd.

(57) ABSTRACT

A current-perpendicular-to-the-plane (CPP) structure magnetoresistive (MR) element includes a pinned magnetic layer made of a granular film. The granular film contains electrically-conductive magnetic crystal grains and an dielectric material. The dielectric material serves to thin the path of the sensing electric current in the pinned magnetic layer. Moreover, the sensing electric current concentrates at the magnetic crystal grains. A larger variation can be obtained in the voltage of the sensing electric current. The output of the CPP structure MR element can be enhanced.

4 Claims, 3 Drawing Sheets

CURRENT-PERPENDICULAR-TO-THE-PLANE STRUCTURE MAGNETORESISTIVE ELEMENT HAVING THE FREE AND/OR PINNED LAYERS BEING MADE OF A GRANULAR FILM WHICH INCLUDES AN ELECTRICALLY CONDUCTIVE MAGNETIC MATERIAL AND A DIELECTRIC MATERIAL

BACKGROUND OF THE INVENTION

1. Field of the Invention

The present invention relates to a magnetoresistive (MR) element utilizing a magnetoresistive (MR) film such as a so-called spin valve film, for example. In particular, the invention relates to a current-perpendicular-to-the-plane (CPP) structure MR element allowing a sensing current to have a component perpendicular to the surface of a substratum receiving a MR film.

2. Description of the Prior Art

A conventional CPP structure MR element often includes a so-called spin valve film. The spin valve film includes a free magnetic layer and a pinned magnetic layer. A non-magnetic intermediate layer is interposed between the free and pinned magnetic layers. The non-magnetic intermediate layer serves to isolate the magnetization of the free magnetic layer from the pinned magnetic layer. The magnetization is allowed to rotate in the free magnetic layer in response to changes in the polarization of the magnetic field acting on the free magnetic layer. The rotation of the magnetization causes the electric resistance of the spin valve film to vary. Variation is induced in the voltage of the sensing current flowing through the spin valve film.

In general, the spin valve film is made of electrically-conductive materials. The sensing current is allowed to flow in the spin valve film over the entire cross-section. Unless the spin valve film is further diminished, it is impossible to reduce the cross-section of the path for the sensing current. If the path for the sensing current is thinned, a larger variation in voltage can be detected in the sensing current. The output of the CPP structure MR element can be enhanced.

SUMMARY OF THE INVENTION

It is accordingly an object of the present invention to provide a CPP structure MR element capable of supplying an enhanced output without an excessive diminishment.

According to the present invention, there is provided a current-perpendicular-to-the-plane (CPP) structure magnetoresistive (MR) element comprising: a free magnetic layer; a pinned magnetic layer; and an electrically-conductive non-magnetic intermediate layer interposed between the free and pinned magnetic layers, wherein at least one of the free and pinned magnetic layers is made of a granular film including an electrically-conductive magnetic material and a dielectric material.

When the CPP structure MR element receives a magnetic field from the outside, the magnetization of the free magnetic layer is allowed to rotate in response to the inversion of the magnetic polarity. The rotation of the magnetization in the free magnetic layer induces a larger variation of the electric resistance in the free and pinned magnetic layers as well as the non-magnetic intermediate layer. When an electric current flows through the free and pinned magnetic layer and the non-magnetic intermediate layer in a so-called perpendicular direction, a variation in the level of any parameter such as voltage appears, in response to the variation in the magnetoresistance, in the electric current. In particular, the dielectric material serves to thin the path of the electric current in the pinned magnetic layer. Moreover, the flow of the electric current concentrates at the electrically-conductive magnetic material. A larger variation can be obtained in the voltage of the electric current. The output of the CPP structure MR element can thus be enhanced.

Here, the electrically-conductive magnetic material preferably contains crystal grains penetrating through the granular film from the upper interface or joint surface to the lower interface or joint surface. The granular film enables a reliable contact of the electrically-conductive magnetic material with electrically-conductive material layers contacting the upper and lower joint surfaces. The electrically-conductive magnetic material thus enjoys a reliable flow of the electric current. The output of the CPP structure MR element can reliably be enhanced.

The crystal grains should include at least one of cobalt and iron atoms. The crystal grains may have a hard magnetic property or a soft magnetic property. The dielectric material may include at least one of an oxide, a fluoride, a carbide and a nitride.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
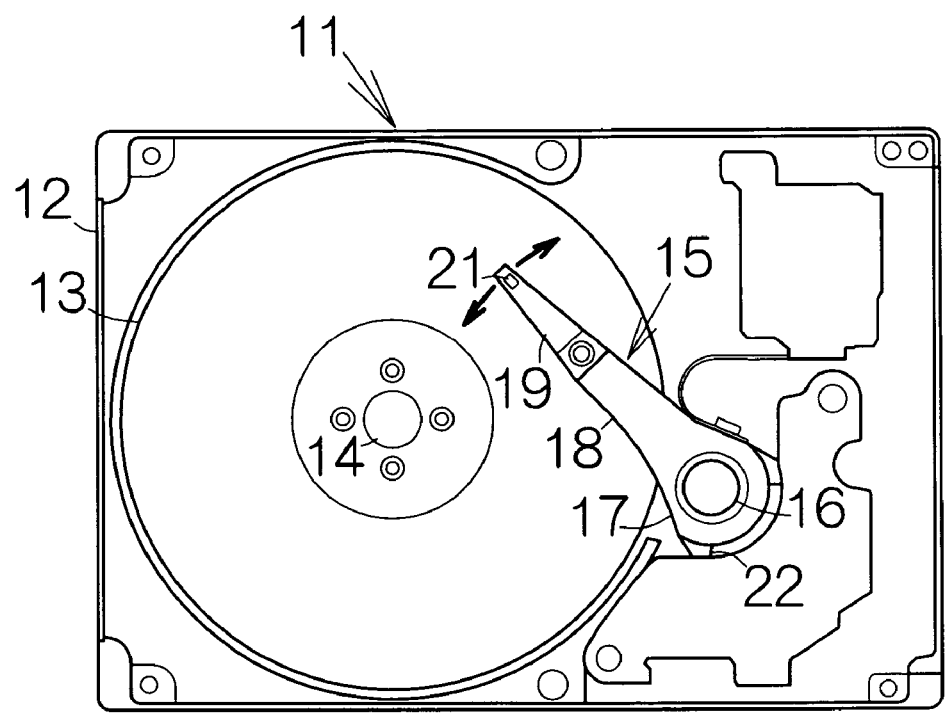
FIG. 1 is a plan view schematically illustrating the structure of a hard disk drive (HDD)

FIG. 1 schematically illustrates the inner structure of a hard disk drive (HDD) 11 as an example of a magnetic recording device or storage system. The HDD 11 includes a box-shaped main enclosure 12 defining an inner space of a flat parallelepiped, for example. At least one magnetic recording disk 13 is incorporated in the inner space within the main enclosure 12. The magnetic recording disk 13 is mounted on the driving shaft of a spindle motor 14. The spindle motor 14 is allowed to drive the magnetic recording disk 13 for rotation at a higher revolution speed such as 7,200 rpm or 10,000 rpm, for example. A cover, not shown, is coupled to the main enclosure 12 so as to define the closed inner space between the main enclosure 12 and itself.

A head actuator 15 is also incorporated within the inner space of the main enclosure 12. The head actuator 15 includes an actuator block 17 supported on a vertical support shaft 16 for rotation. Rigid actuator arms 18 are defined in the actuator block 17. The actuator arms 18 are designed to extend in a horizontal direction from the vertical support shaft 16. The actuator arms 18 are associated with the front and back surfaces of the magnetic recording disk or disks 13, respectively. The actuator block 17 may be made of aluminum. Molding process may be employed to form the actuator block 17.

Elastic head suspensions 19 are fixed to the tip ends of the actuator arms 18. The individual head suspension 19 is designed to extend forward from the corresponding tip end of the actuator arm 18. As conventionally known, a flying head slider 21 is supported on the front end of the individual head suspension 19. The flying head sliders 21 are opposed to the surfaces of the magnetic recording disk or disks 13.

The head suspension 19 serves to urge the flying head slider 21 toward the surface of the magnetic recording disk 13. When the magnetic recording disk 13 rotates, the flying head slider 21 is allowed to receive airflow generated along the rotating magnetic recording disk 13. The airflow serves to generate a lift on the flying head slider 21. The flying head slider 21 is thus allowed to keep flying above the surface of the magnetic recording disk 13 during the rotation of the magnetic recording disk 13 at a higher stability established by the balance between the lift and the urging force of the head suspension 19.

A power source 22 such as a voice coil motor (VCM) is connected to the tail of the actuator block 17. The power source 22 drives the actuator block 17 for rotation around the support shaft 16. The rotation of the actuator block 17 induces the swinging movement of the actuator arms 18 and the head suspensions 19. When the actuator arm 18 is driven to swing about the support shaft 16 during the flight of the flying head slider 21, the flying head slider 21 is allowed to cross the recording tracks defined on the magnetic recording disk 13 in the radial direction of the magnetic recording disk 13. This radial movement serves to position the flying head slider 21 right above a target recording track on the magnetic recording disk 13. As conventionally known, in the case where two or more magnetic recording disks 13 are incorporated within the inner space of the main enclosure 12, a pair of the elastic head suspensions 19 and the actuator arms 18 are disposed between the adjacent magnetic recording disks 13.

Figure 2:
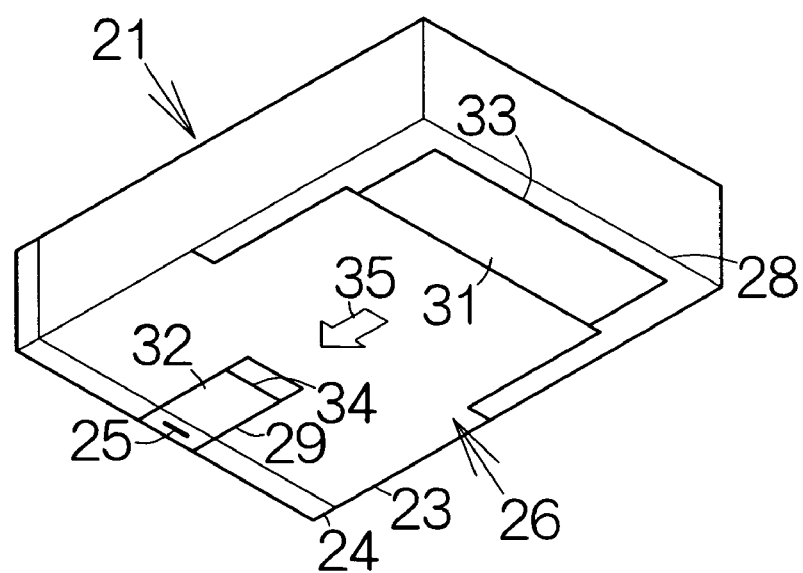
FIG. 2 is an enlarged perspective view schematically illustrating the structure of a flying head slider according to a specific example.

FIG. 2 illustrates a specific example of the flying head slider 21. The flying head slider 21 includes a slider body 23 made of $Al_2O_3$—TiC in the form of a flat parallelepiped. A head protection layer 24 made of $Al_2O_3$ (alumina) is coupled to the outflow or trailing end of the slider body 23. The read/write electromagnetic transducer 25 is contained within the head protection layer 24. A medium-opposed surface or bottom surface 26 is defined over the slider body 23 and the head protection layer 24 so as to face the magnetic recording disk 13 at a distance.

A front rail 28 and a rear rail 29 are formed on the bottom surface 26. The front rail 28 is designed to extend along the inflow or leading end of the slider body 23. The rear rail 29 is located near the outflow or trailing end of the slider body 23. Air bearing surfaces (ABSs) 31, 32 are respectively defined on the top surfaces of the front and rear rails 28, 29. The inflow ends of the air bearing surfaces 31, 32 are connected to the top surfaces of the front and rear rails 28, 29 through steps 33, 34, respectively. The read/write electromagnetic transducer 25 exposes the tip or front end at the air bearing surface 32. It should be noted that the front end of the read/write electromagnetic transducer 25 may be covered with a protection layer, made of diamond-like-carbon (DLC), extending over the air bearing surface 32.

The bottom surface 26 of the flying head slider 21 is designed to receive airflow 35 generated along the rotating magnetic recording disk 13. The steps 33, 34 serve to generate a relatively larger positive pressure or lift at the air bearing surfaces 31, 32. Moreover, a larger negative pressure is induced behind the front rail 28. The negative pressure is balanced with the lift so as to stably establish a flying attitude of the flying head slider 21. The flying head slider 21 may take any shape or form other than the aforementioned one.

Figure 3:
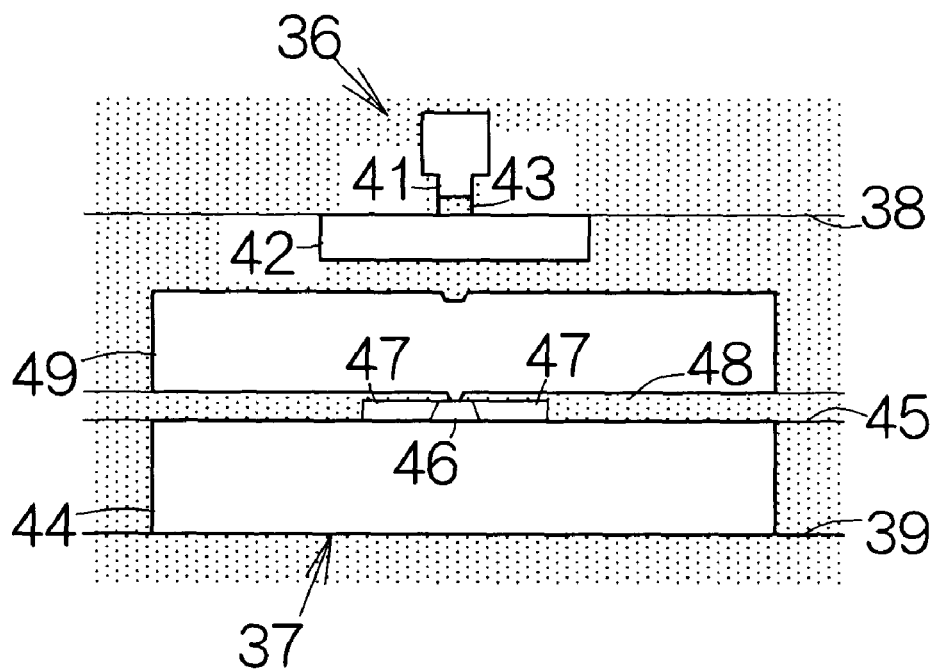
FIG. 3 is a front view schematically illustrating a read/write electromagnetic transducer observed at an air bearing surface of the flying head slider.

FIG. 3 illustrates an enlarged detailed view of the read/write electromagnetic transducer 25 exposed at the air bearing surface 32. The read/write electromagnetic transducer comprises an inductive write element or a thin film magnetic head 36 and a current-perpendicular-to-the-plane (CPP) structure electromagnetic transducer element or CPP structure magnetoresistive (MR) read element 37. The thin film magnetic head 36 is designed to write a magnetic bit data onto the magnetic recording disk 13 by utilizing a magnetic field induced in a conductive swirly coil pattern, not shown, for example. The CPP structure MR read element 37 is designed to detect a magnetic bit data by utilizing variation of the electric resistance in response to the inversion of the magnetic polarity in a magnetic field acting from the magnetic recording disk 13. The thin film magnetic head 36 and the CPP structure MR read element 37 are interposed between an $Al_2O_3$ (alumina) layer 38 as an upper half layer of the head protection layer 24 or overcoat film and an $Al_2O_3$ (alumina) layer 39 as a lower half layer of the head protection layer 24 or undercoat film.

The thin film magnetic head 36 includes an upper magnetic pole layer 41 exposing the front end at the air bearing surface 32, and a lower magnetic pole layer 42 likewise exposing the front end at the air bearing surface 32. The upper and lower magnetic pole layers 41, 42 may be made of FeN, NiFe, or the like, for example. The combination of the upper and lower magnetic pole layers 41, 42 establishes the magnetic core of the thin film magnetic head 36.

A non-magnetic gap layer 43 is interposed between the upper and lower magnetic pole layers 41, 42. The non-magnetic gap layer 43 may be made of $Al_2O_3$ (alumina), for example. When a magnetic field is induced at the conductive swirly coil pattern, a magnetic flux is exchanged between the upper and lower magnetic pole layers 41, 42. The non-magnetic gap layer 43 allows the exchanged magnetic flux to leak out of the air bearing surface 32. The thus leaked magnetic flux forms a magnetic field for recordation, namely, a write gap magnetic field.

The CPP structure MR read element 37 includes a lower electrode 44 spreading over the upper surface of the alumina layer 39 as a basement insulation layer. The lower electrode 44 may have not only a property of electric conductors but also a soft magnetic property. If the lower electrode 44 is made of a soft magnetic electric conductor, such as NiFe, for example, the lower electrode 44 is also allowed to serve as a lower shield layer for the CPP structure MR read element 37.

A flattened surface 45 is defined on the upper surface of the lower electrode 44 as a substratum. A magnetoresistive (MR) film or spin valve film 46 is overlaid on the flattened surface 45. The spin valve film 46 is patterned into a predetermined contour. The spin valve film 46 extends rearward from the tip or front end exposed at the air bearing surface 32 along the flattened surface 45. Likewise, a pair of hard magnetic domain controlling films 47 are overlaid on the flattened surface 45. The domain controlling films 47 are allowed to extend along the air bearing surface 32. The spin valve film 46 is interposed between the domain controlling films 47 on the flattened surface 45 along the air bearing surface 32. The domain controlling films 47 may be made of a metal material such as CoPt, CoCrPt, or the like. The domain controlling films 47 serve to establish a magnetization across the spin valve film 46 in parallel with the air bearing surface 32. When a biasing magnetic field is established based on the magnetization by the domain controlling films 47, a free layer of the spin valve film 46 is allowed to enjoy the single domain property. The structure of the spin valve film 46 will be described later in detail.

The flattened surface 45 is covered with an overlaid insulation layer 48. The overlaid insulation layer 48 may be made of an insulating material such as $Al_2O_3$, $SiO_2$, or the like. An upper electrode 49 is located on the overlaid insulation layer 48. The upper electrode 49 may have not only a property of electric conductors but also a soft magnetic property. If the upper electrode 49 is made of a soft magnetic electric conductor, such as NiFe, for example, the upper electrode 49 is also allowed to serve as an upper shield layer for the CPP structure MR read element 37. The distance between the aforementioned lower electrode 44 and the upper electrode 49 determines a linear resolution of recordation along a recording track on the magnetic recording disk 13.

Figure 4:
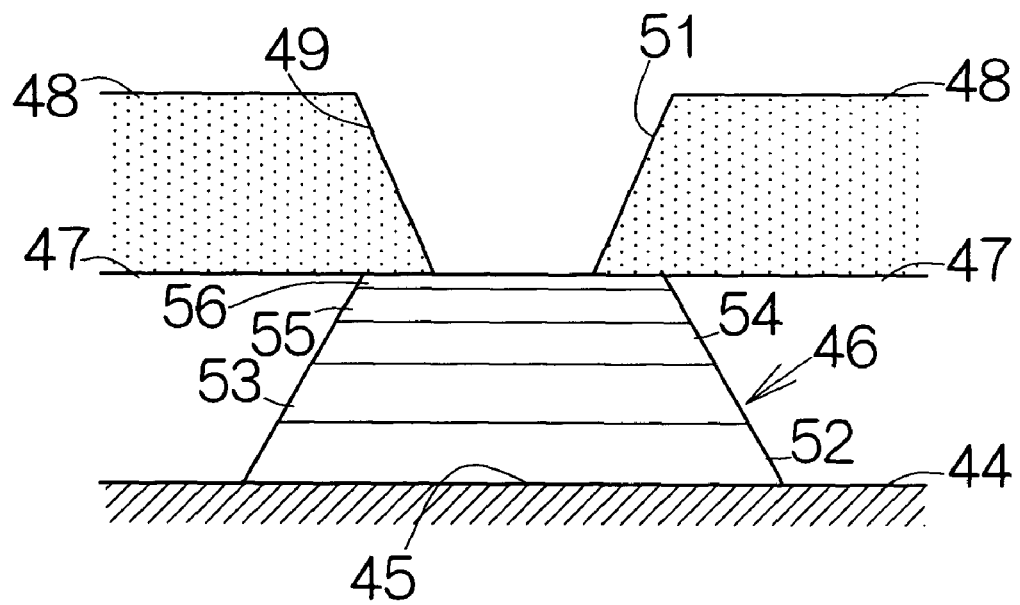
FIG. 4 is an enlarged front view schematically illustrating the structure of a current-perpendicular-to-the-plane (CPP) structure magnetoresistive (MR) read element according to a first embodiment of the present invention.

FIG. 4 illustrates an enlarged view of the CPP structure MR read element 37. As is apparent from FIG. 4, the overlaid insulation layer 48 covers over the spin valve film 46 and the domain controlling films 47. A contact hole 51 is defined in the overlaid insulation layer 48. The contact hole 51 is designed to penetrate through the overlaid insulation layer 48 so as to reach the top surface of the spin valve film 46. The contact hole 51 is located adjacent the air bearing surface 32. The upper electrode 49 is allowed to contact the top surface of the spin valve film 46 within the contact hole 51. An electric connection can be established between the upper electrode 49 and the spin valve film 46 in this manner. At the same time, the upper electrode 49 is electrically isolated from the domain controlling films 47.

As is apparent from FIG. 4, the spin valve film 46 according to a first embodiment of the present invention includes a basement layer 52, a pinned ferromagnetic layer 53, an electrically-conductive non-magnetic intermediate layer 54, a free ferromagnetic layer 55 and a protection cap layer 56, spreading over the flattened surface 45 in this sequence. The magnetization of the pinned ferromagnetic layer 53 is fixed in a specific lateral direction based on a hard magnetic property of its own, for example. The basement layer 52 may include a Ta layer overlaid on the flattened surface 45, and a NiFe layer overlaid on the upper surface of the Ta layer, for example. The non-magnetic intermediate layer 54 may be made of Cu, for example. The free ferromagnetic layer 55 may be made of a CoFeB layer, for example. The protection cap layer 56 may be made of a Cu layer, a Au layer, or the like.

Figure 5:
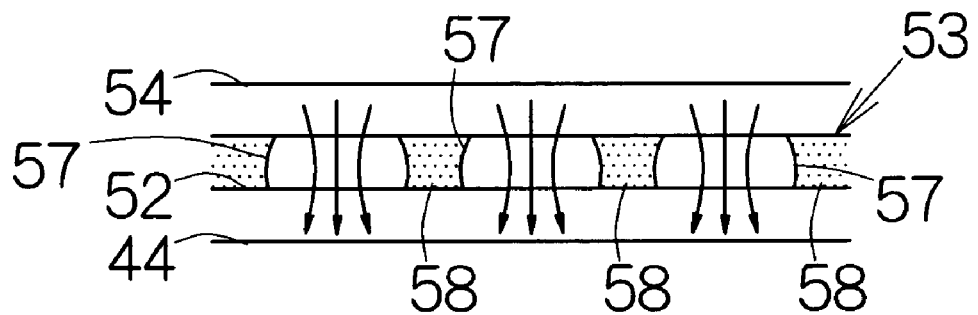
FIG. 5 is an enlarged partial sectional view of a spin valve film for schematically illustrating the structure of a granular film.

The pinned ferromagnetic layer 53 is made of a granular film including electrically-conductive ferromagnetic atoms and dielectric atoms. As shown in FIG. 5, magnetic crystal grains 57 are established in the granular film. The individual magnetic crystal grains 57 stand on the upper surface of the basement layer 52. Spaces between the adjacent magnetic crystal grains 57 are filled with a dielectric material 58. At the same time, the tip ends of the magnetic crystal grains 57 are allowed to get exposed at the interface contacting the non-magnetic intermediate layer 54. The individual magnetic crystal grains 57 in this manner penetrate through the granular film from the upper interface or joint surface to the lower interface or joint surface. The magnetic crystal grains 57 serve to establish an electric connection between the non-magnetic intermediate layer 54 and the basement layer 52.

Here, the magnetic crystal grains 57 may be made of a hard magnetic material such as CoPt alloy, FePt alloy, or the like. The hard magnetic material may also include a rare earth element alloy including a transition element. The dielectric material 58 may be made of an oxide such as $Al_2O_3$, $SiO_2$, MgO, $Bi_2O_3$, a fluoride such as $MgF_2$, $CaF_2$, a nitride such as AlN, a carbide, and other types of insulating material.

When the CPP structure MR read element 37 is opposed to the surface of the magnetic recording disk 13 for reading a magnetic information data, the magnetization of the free ferromagnetic layer 55 is allowed to rotate in the spin valve film 46 in response to the inversion of the magnetic polarity applied from the magnetic recording disk 13. The rotation of the magnetization in the free ferromagnetic layer 55 induces variation of the electric resistance in the spin valve film 46. When a sensing electric current is supplied to the spin valve film 46 through the upper and lower electrodes 49, 44, a variation in the level of any parameter such as voltage appears, in response to the variation in the magnetoresistance, in the sensing electric current output from the upper and lower electrodes 49, 44. The variation in the level can be utilized to detect a magnetic bit data recorded on the magnetic recording disk 13.

In particular, the dielectric material 58 serves to thin the path of the sensing electric current in the pinned ferromagnetic layer 53. Moreover, the flow of the sensing electric current concentrates at the magnetic crystal grains 57. A larger variation can be obtained in the voltage of the sensing electric current. The output of the CPP structure MR read element 37 can thus be enhanced.

Next, a brief description will be made on a method of making the CPP structure MR read element 37. The lower electrode 44 is formed on a wafer in a conventional manner. Plating may be employed to form the lower electrode 44, for example. The basement layer 52 comprising the Ta and NiFe layers is then formed over the upper surface of the lower electrode 44. Sputtering may be employed to form the basement layer 52, for example.

A hard magnetic material such as CoPt alloy or FePt alloy is thereafter layered on the upper surface of the basement layer 52. Sputtering may be employed, for example. In this case, the sputtering apparatus may be controlled to deposit the hard magnetic material by the expected thickness of approximately 2.8 nm. Discrete or isolated islands of the hard magnetic material can be obtained on the upper surface of the basement layer 52. The island of the hard magnetic material corresponds to one of the magnetic crystal grains 57 having the diameter of approximately 5.0 nm scattered on the surface of the basement layer 52.

An insulating material such as $SiO_2$ is then deposited on the upper surface of the basement layer 52. Sputtering may be employed, for example. In this case, the sputtering apparatus may be controlled to deposit the insulating material by the expected thickness of approximately 2.0 nm. The insulating material is expected to first deposit on spaces between the adjacent magnetic crystal grains 57. The upper surface of the basement layer 52 is in this manner covered with the insulating material between the adjacent magnetic crystal grains 57. The magnetic crystal grains 57 are allowed to keep exposed out of the deposited insulating material. The granular film has been formed in this manner.

An electrically-conductive non-magnetic material such as Cu, a ferromagnetic material having a soft magnetic property such as CoFe alloy, an electrically-conductive material such as Cu or Au are sequentially deposited on the upper surface of the granular film. A layered mass has been formed. The spin valve film 46 is cut out of the layered mass. Ion milling may be employed to shape the spin valve film 46 out of the layered mass, for example. A photoresist film may be formed on the layered mass to pattern the spin valve film 46.

When the spin valve film 46 has been formed, a hard magnetic material such as CoCrPt is deposited around the spin valve film 46. The overlaid insulation layer 48 is then formed on the upper surfaces of the spin valve film 46 and the deposited hard magnetic material. The contact hole 51 is formed in the overlaid insulation layer 48. The upper electrode 49 is thereafter formed on the overlaid insulation layer 48. The CPP structure MR read element 37 is formed in the aforementioned manner.

Figure 6:
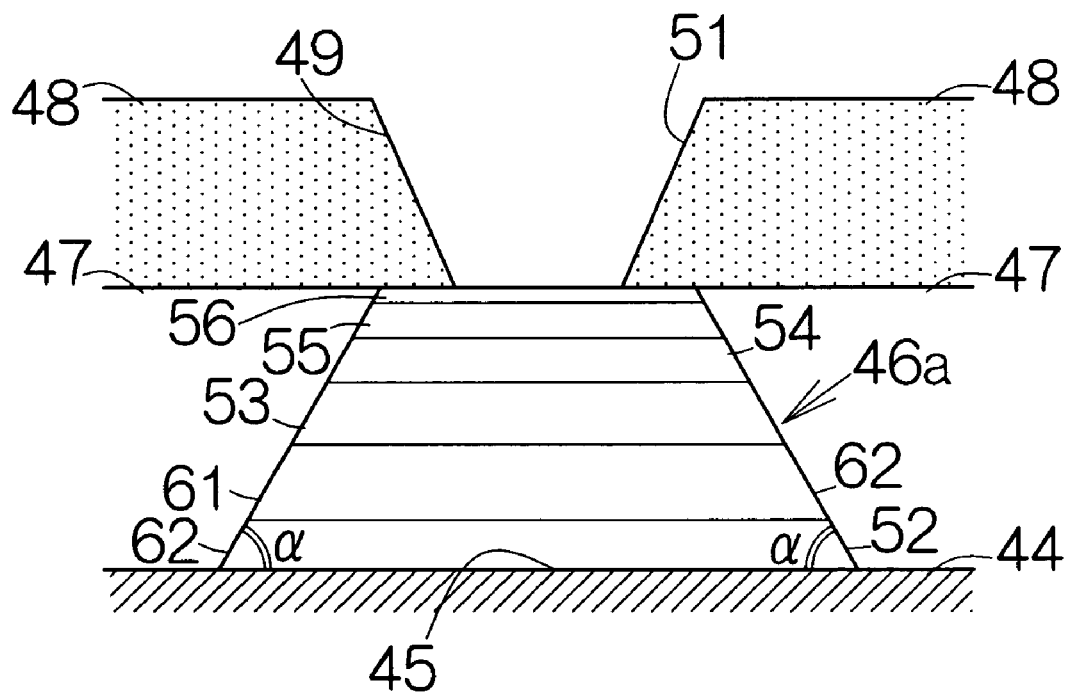
FIG. 6 is an enlarged front view schematically illustrating the structure of a CPP structure MR read element according to a second embodiment of the present invention.

FIG. 6 schematically illustrates the structure of the CPP structure MR read element according to a second embodiment of the present invention. The CPP structure MR read element of the second embodiment is designed to employ a soft magnetic material such as CoFe alloy for the magnetic crystal grains 57 in the pinned ferromagnetic layer 53. A pinning layer or antiferromagnetic layer 61 is interposed between the pinned ferromagnetic layer 53 and the basement layer 52. The magnetization of the pinned ferromagnetic layer 53 is fixed in a specific lateral direction under the influence of the antiferromagnetic layer 61. The antiferromagnetic layer 61 may be made of an antiferromagnetic material such as IrMn, PdPtMn, or the like. The spin valve film 46a of the second embodiment allows the dielectric material 58 in the pinned ferromagnetic layer 53 to thin the path for the sensing electric current in the same manner as described above. Accordingly, a larger variation can be obtained in the voltage of the sensing electric current. Like reference numerals are attached to the structure or components equivalent to those of the aforementioned CPP structure MR read element 37.

In particular, inclined surfaces 62 are usually defined on the spin valve film 46a. The inclined surfaces 62 are inclined by an inclination angle α relative to the upper surface of the lower electrode 44 or substratum. The domain controlling films 47 contact the spin valve film 46a at the inclined surfaces 62, respectively. The inclined surfaces 62 allow the spin valve film 46a to get tapered toward the upper electrode 49. This tapered shape realizes a larger or broader path for the sensing electric current in the antiferromagnetic layer 61 having a relatively higher electric resistance. The electric resistance can substantially be reduced at the antiferromagnetic layer 61.

Otherwise, the aforementioned granular film may be utilized for the free ferromagnetic layer 55 in the spin valve films 46, 46a. In this case, a soft magnetic material such as CoFe alloy may be employed for the magnetic crystal grains 57 incorporated within the free ferromagnetic layer 55, for example. The granular film may be applied to at least one of the free and pinned ferromagnetic layers 55, 53. Moreover, the CPP structure MR read element 37 may employ not only the spin valve film 46, 46a in which the free ferromagnetic layer 55 is located above the pinned ferromagnetic layer 53 but also a spin valve film in which the free ferromagnetic layer 55 is located beneath the pinned ferromagnetic layer 53. In the latter case, the free ferromagnetic layer, the non-magnetic intermediate layer, the pinned ferromagnetic layer, and the antiferromagnetic layer or the protection cap layer are sequentially layered on the basement layer 52 in a conventional manner. In any event, the aforementioned granular film may be applied to at least one of the pinned and free ferromagnetic layers.

What is claimed is:

1. A current-perpendicular-to-the-plane structure magnetoresistive element comprising:
    a free magnetic layer;
    a pinned magnetic layer; and
    an electrically-conductive non-magnetic intermediate layer interposed between the free and pinned magnetic layers, wherein
    at least one of the free and pinned magnetic layers is made of a granular film including an electrically-conductive magnetic material and a dielectric material.

2. The current-perpendicular-to-the-plane structure magnetoresistive element according to claim 1, wherein said electrically-conductive magnetic material contains crystal grains penetrating through the granular film from an upper joint surface to a lower joint surface.

3. The current-perpendicular-to-the-plane structure magnetoresistive element according to claim 2, wherein said crystal grains include at least one of cobalt and iron atoms.

4. The current-perpendicular-to-the-plane structure magnetoresistive element according to claim 3, wherein said dielectric material includes at least one of an oxide, a fluoride, a carbide and a nitride.

* * * * *